(12) United States Patent
Yang et al.

(10) Patent No.: US 10,879,190 B2
(45) Date of Patent: Dec. 29, 2020

(54) PATTERNING INTEGRATION SCHEME WITH TRENCH ALIGNMENT MARKS

(71) Applicant: International Business Machines Corporation, Armonk, NY (US)

(72) Inventors: Chih-Chao Yang, Glenmont, NY (US); Hao Tang, Slingerlands, NY (US); Dominik Metzler, Saratoga Springs, NY (US); Cornelius Brown Peethala, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 35 days.

(21) Appl. No.: 16/400,131

(22) Filed: May 1, 2019

(65) Prior Publication Data

US 2020/0350257 A1 Nov. 5, 2020

(51) Int. Cl.
*H01L 23/544* (2006.01)
*H01L 21/56* (2006.01)
*H01L 21/768* (2006.01)

(52) U.S. Cl.
CPC ............ *H01L 23/544* (2013.01); *H01L 21/56* (2013.01); *H01L 21/76829* (2013.01); *H01L 2223/54406* (2013.01); *H01L 2223/54426* (2013.01)

(58) Field of Classification Search
CPC . H01L 23/544; H01L 21/56; H01L 21/76829; H01L 2223/54406; H01L 2223/54426
See application file for complete search history.

(56) References Cited

U.S. PATENT DOCUMENTS

| | | | |
|---|---|---|---|
| 5,869,383 | A | 2/1999 | Chien et al. |
| 5,899,738 | A | 5/1999 | Wu et al. |
| 6,030,897 | A | 2/2000 | Deconinck |
| 6,825,096 | B2 | 11/2004 | Weis |
| 7,223,612 | B2 | 5/2007 | Sarma |
| 7,442,624 | B2 | 10/2008 | Sarma et al. |
| 7,723,813 | B2 | 5/2010 | Kanakasabapathy et al. |
| 2006/0024923 | A1* | 2/2006 | Sarma .................. H01L 23/544 438/462 |

* cited by examiner

*Primary Examiner* — Kyoung Lee
(74) *Attorney, Agent, or Firm* — Cantor Colburn LLP; James Nock (57) ABSTRACT

Methods are provided for patterning an active region formed in a semiconductor wafer. In one aspect, the methods generally include providing active regions and kerf regions between active regions in the semiconductor wafer, wherein the active regions and the kerf regions include a patterned dielectric layer, a metal conductor, and a liner layer between the dielectric layer and the metal conductor. An upper surface of the active regions and the kerf regions is planarized to form a planar surface. The metal conductor from the kerf regions is selectively removed to form a trench. An optically opaque layer is conformally deposited onto the semiconductor wafer to form a recessed alignment mark in the kerf regions. The active regions are then patterned using the recessed alignment mark in the kerf region.

20 Claims, 4 Drawing Sheets

PATTERNING INTEGRATION SCHEME WITH TRENCH ALIGNMENT MARKS

BACKGROUND

The present invention relates in general to semiconductor manufacture, and more particularly, to systems and methods a patterning integration scheme with trench alignment marks.

Generally, semiconductor devices are fabricated by depositing a plurality of insulating, conductive and semi-conductive material layers over a substrate or workpiece and patterning the various material layers to form desired integrated circuits and electronic elements thereon. Each layer is typically aligned to an underlying material layer using alignment marks. The tools used to fabricate semiconductor devices visually locate the alignment marks, the position of which are programmed into the tools. All of these multiple patterned layers must be aligned correctly in order for any of the devices to operate properly. Any variations in alignment are generally referred to as overlay errors, which can be measured using metrology in order to determine whether two layers on a substrate are aligned or not. Minimizing overlay errors is important for achieving high yield and reliability, and for ensuring that devices meet performance specifications. Any devices outside the tolerances for overlay will need to be reworked, which is costly and time consuming.

If a material layer is transparent or translucent, as many insulating material layers and semiconductive material layers are, as well as photoresists or hard masks that are used as masks to pattern material layers, the tool can "see through" the insulating layer, semiconductor material layer or photoresist and locate the alignment marks. However, for advanced design rules many of the conductive layers are optically opaque, and thus additional steps must be taken to align them.

SUMMARY

Systems and methods for a patterning integration scheme with trench alignment marks are described herein. A non-limiting example of a method of fabricating a device in accordance with one or more aspects of the present invention includes providing a semiconductor wafer including multiple active regions separated by kerf regions. The active regions and the kerf regions include a patterned dielectric layer, a metal conductor in the patterned dielectric layer and a liner layer intermediate the dielectric layer and the metal conductor. The metal conductor has an upper surface coplanar with an upper surface of the dielectric layer. An optically transparent layer is formed on the semiconductor wafer and patterned to selectively remove the optically transparent layer from the kerf region. The metal conductor is removed from the kerf region and the optically transparent layer is removed from the active region. An optically opaque layer is conformally deposited onto the semiconductor wafer creating topography in the kerf region. A lithographic stack is deposited onto the semiconductor wafer including an organic planarization layer and a photoresist layer thereon. Openings in the lithographic stack are patterned to the optically opaque layer in the active regions using the topography in the kerf region as an alignment mark.

A non-limiting example of a method of fabricating of fabricating a device according to embodiments of the invention includes providing a semiconductor wafer including multiple active regions separated by a kerf region. The active regions and the kerf regions include a patterned dielectric layer, a metal conductor in the patterned dielectric layer, and a liner layer encapsulating the metal conductor. The liner layer has an upper surface coplanar with an upper surface of the dielectric layer. An optically transparent layer is formed on the semiconductor wafer and patterned to selectively remove the optically transparent layer from the kerf region. The metal conductor is selectively removed from the kerf region and the optically transparent layer is selectively removed from the active region. An opaque layer is conformally deposited onto the semiconductor wafer creating topography in the kerf region. A lithographic stack is deposited onto the semiconductor wafer including an organic planarization layer and a photoresist layer thereon. Openings in the lithographic stack to the opaque layer in the active regions are patterned using the topography in the kerf region as an alignment mark.

A non-limiting example of a method of patterning an active region formed in a semiconductor wafer according to embodiments of the invention includes providing kerf regions between active regions in the semiconductor wafer. The active regions and the kerf regions include a patterned dielectric layer, a metal conductor, and a liner layer between the dielectric layer and the metal conductor. Upper surfaces of the active regions and the kerf regions are planarized to form a planar surface. The metal conductor from the kerf regions is selectively removing to form a trench. An optically opaque layer is conformally deposited onto the semi-conductor wafer to form a recessed alignment mark in the kerf regions. The active regions are patterned using the recessed alignment mark in the kerf region.

Additional features and advantages are realized through the techniques of the present invention. Other embodiments and aspects of the invention are described in detail herein and are considered a part of the claimed invention. For a better understanding of the invention with advantages and features, refer to the description and to the drawings.

DETAILED DESCRIPTION

One way to align optically opaque layers is to form recessed alignment marks in an underlying material layer, by forming them simultaneously while conductive lines or vias are formed in a damascene process, removing a portion of the material from the alignment marks, and depositing the opaque layer over the material layer with recessed alignment marks. In theory, the alignment marks would then be visible on the top surface of the opaque layer, e.g., as depressions.

However, if the recessed alignment marks are formed in a damascene formed layer, such as conductive lines or vias formed in an insulating layer, and the insulating layer is subjected to a chemical mechanical polish (CMP) process, (as is typical to remove excess conductive material from the top surface of the insulating layer to form the conductive lines or vias) the edges of the alignment marks become eroded by the CMP process, and thus the edges are not sharp. This makes it difficult to use the alignment marks to align a subsequently deposited opaque layer, because the depressions transferred to the topography of the opaque layer are not as visible on the top surface of the opaque layer. The presence of clearly defined alignment marks is required for extremely tight alignment tolerance, as dictated by device performance.

There are other problems with using a CMP process over recessed alignment marks. Debris from the CMP slurry can become trapped in the alignment marks, making the topography of a subsequently deposited layer less visible, or not visible at all, particularly if the alignment marks are shallow. In addition, the deposition of opaque layers over such alignment marks give rise to jagged edges in the depressions in the topography of the opaque layer over the alignment marks, making the depressions unusable for alignment. Furthermore, the CMP slurry materials left in the alignment marks can react with some materials used in subsequent etch processes, such as chlorine or fluorine, causing the alignment marks to explode, making them unusable as alignment marks. This creates foreign materials all over the chip, leads to delamination of layers, and thus adversely affects the device performance and reduces yield.

In various aspects of the present invention, topography created in the kerf regions is utilized as alignment marks for patterning the optically opaque stacks in the active areas that include the devices. The topography in the kerf region is created subsequent to CMP, thereby overcoming the above noted problems in the prior art Detailed embodiments of the patterning integration scheme with trench alignment marks according to aspects of the present invention will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

It is to be understood that the various layers and/or regions shown in the accompanying drawings are not drawn to scale, and that one or more layers and/or regions of a type commonly used in complementary metal-oxide semiconductor (CMOS) fabrication techniques, fin field-effect transistor (FinFET) devices, metal-oxide-semiconductor field-effect transistor (MOSFET) devices, and/or other semiconductor fabrication techniques and devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random-access memory (DRAM), embedded dynamic random access memory (EDRAM), flash memory and combinations thereof. The at least one device layer can also include passive devices, such as resistors and capacitors, as well as electrical connections to the devices containing within the at least one device layer.

It should also be noted that not all masking, patterning, and lithography processes are shown, because a person of ordinary skill in the art would recognize where masking and patterning are utilized to form the identified layers and openings, and to perform the identified selective etching processes, as described herein.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

Turning now to an overview of technologies that are more specifically relevant to aspects of the invention, back end of line (BEOL) processes are generally focused on forming metal interconnects between the different devices of the integrated circuit whereas the fabrication of the different devices that make up the integrated circuit are generally done during the front end of line (FEOL) processing.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer can be by one or more deposition processes, where, for example, a conformal layer can be formed by a first process (e.g., ALD, PEALD, etc.) and a fill can be formed by a second process (e.g., CVD, electrodeposition, PVD, etc.).

Exemplary applications/uses to which the present invention can be applied include, but are not limited to: transistors for complementary metal-oxide-semiconductor (CMOS) devices, logic devices (e.g., NAND gates, NOR gates, XOR gates, etc.), memory devices (e.g., DRAM, SRAM, flip-flops, etc.), and complex (e.g., VLSI, ULSI, etc.) application specific integrated circuits (ASICS) and processors.

It is to be understood that the present invention will be described in terms of a given illustrative architecture; however, other architectures, structures, substrate materials, process features, and steps can be varied within the scope of the present invention.

Figure 1:
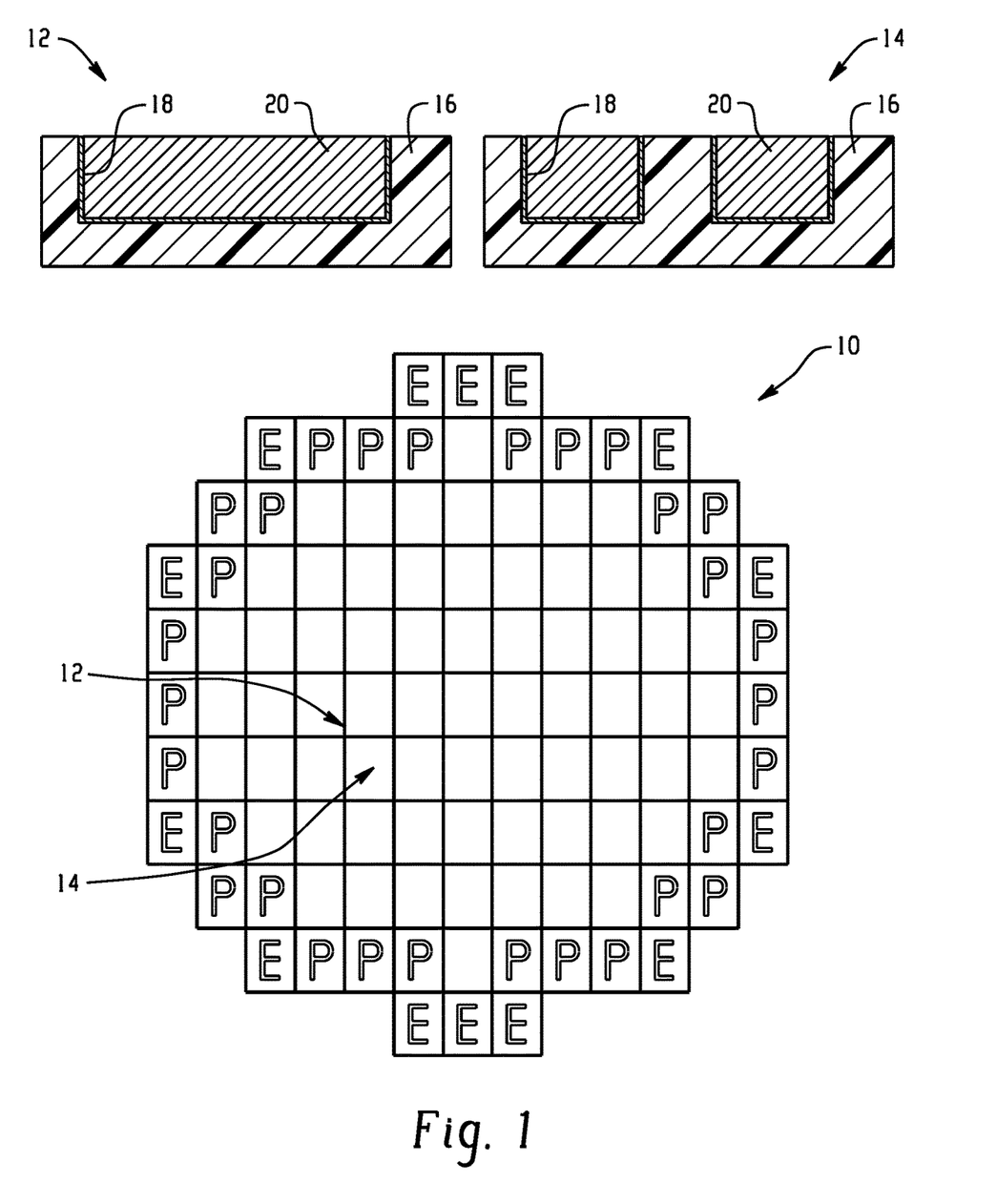
FIG. 1 illustrates a top plan view of a semiconductor wafer and sectional views of a kerf region and an active region in accordance with one or more embodiments of the present invention.

Referring now to the drawings in which like numerals represent the same or similar elements and initially to FIG. 1, a semiconductor wafer 10 includes kerf regions 12 and device regions 14. The device regions 14, also referred to herein as the active regions, contain the useful circuitry, while the kerf regions 12 (which encompasses the chip) includes all the test devices, alignment marks and the like that are necessary to the fabrication of the circuit devices of the chip. The kerf regions exist between device regions and are typically destroyed when the wafer is diced into chips by a diamond saw. Both the kerf regions and the device regions generally include a trench patterned dielectric layer 16, a liner layer 18 (i.e., a diffusion barrier layer to prevent diffusion of the conductor into the dielectric material 12), and a metal conductor 20, wherein the wafer 10 is subsequently planarized to provide the structure 10 as shown.

The dielectric layer 16 can be any dielectric material including inorganic dielectrics or organic dielectrics. The dielectric material can be porous or non-porous. Some examples of suitable dielectrics that can be used as the dielectric material include, but are not limited to: SiN, SiC, SiC (N,H), $SiO_2$, silsesquioxanes, carbon doped oxides (i.e., organosilicates) that include atoms of Si, C, 0 and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The interlayer dielectric can be deposited by PECVD procedures as is generally known in the art.

The liner layer 18 can be formed of tantalum (Ta), tantalum nitride (TaN), cobalt (Co), ruthenium (Ru), titanium (Ti), titanium nitride (TiN), tungsten nitride (WN), or combinations thereof. The liner layer 16 can be deposited by PVD, CVD, or ALD processes.

The conductor 20 can be any suitable conductor including, but not limited to copper (Cu), cobalt (Co), aluminum (Al), ruthenium (Ru), nickel (Ni), iridium (Jr), rhenium (Rh), tungsten, and or combinations including at least one of the aforementioned conductors. In some structures, a copper metal layer can be used and can optionally include an alloying element such as carbon (C), nitrogen (N), oxygen (O), chlorine (Cl) or sulfur(S), which have been shown to improve the reliability of the copper conductor. The amount of alloying element in the copper alloy is typically in the range of about 0.001 weight percent (wt. %) to about 10 wt %).

The conductor 20 can be formed by CVD, sputtering, electrochemical deposition or like processes. For example, the deposition of copper can proceed by electrochemical deposition such as electroplating or electroless plating.

Following formation of the metal layer to define the conductor 20, the semiconductor wafer 10 is subjected to a planarization process to remove any metal overburden (includes seed layer and liner layer removal) such that a top surface of the conductor 20 is substantially coplanar to the dielectric layer 16 as shown. For example, the surface can be planarized using an electropolishing process. In an electropolishing process, small amounts of metal are etched by electroetch or electrochemical etching to provide a metal interconnect having a top conductor surface generally coplanar to the top surface of the dielectric. In another embodiment, the planar surface is formed by chemical mechanical polishing (CMP). The CMP process planarizes the surface of the interconnect structure by a combination of chemical and mechanical forces using a non-selective slurry composition generally known in the art. The slurry composition contains a silica abrasive material, which removes the different metal layers at substantially the same rate. Alternatively, a planar surface can be formed by a non-selective plasma etching process. The plasma etching process can include additional planarizing layers deposited onto metal layer. For example, a layer of photoresist can be deposited onto metal layer prior to performing the non-selective etch process.

Because there are no recessed alignment marks, debris formed and/or provided from the CMP slurry cannot become trapped and is easily removed during a rinse step.

Figure 2:
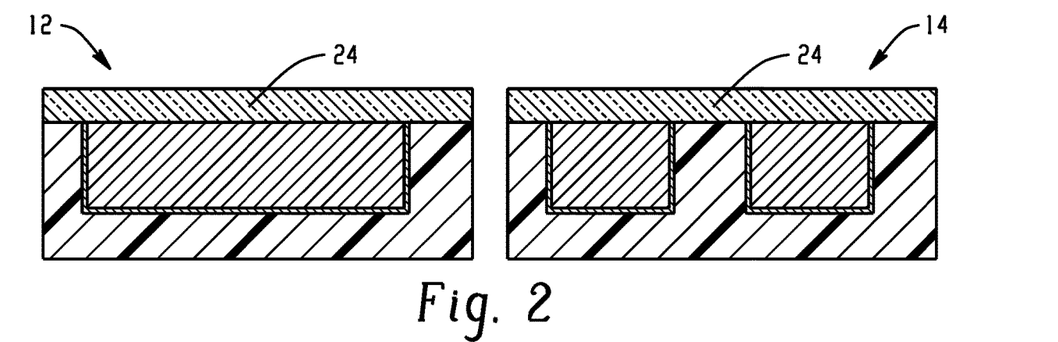
FIG. 2 illustrates sectional views of a kerf region and an active region subsequent to deposition of a sacrificial nitride layer thereon in accordance with one or more embodiments of the present invention.

After planarization, a sacrificial nitride layer 24 is deposited onto the substrate 10 overlying both the kerf region 12 and the active region 14 as shown in FIG. 2. The sacrificial nitride layer 24 is not intended to be limited and can be SiN, or SiN(H), which is optically transparent.

Figure 3:
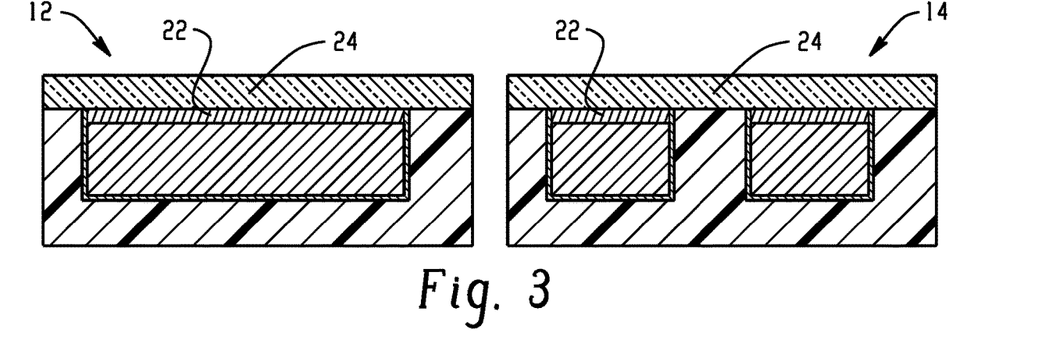
FIG. 3 illustrates sectional views of a kerf region and an active region subsequent to deposition of a sacrificial nitride layer thereon, wherein the kerf region and the active region include a barrier layer on top surfaces thereof and coplanar to a dielectric layer in accordance with one or more embodiments of the present invention.
Figure 4:
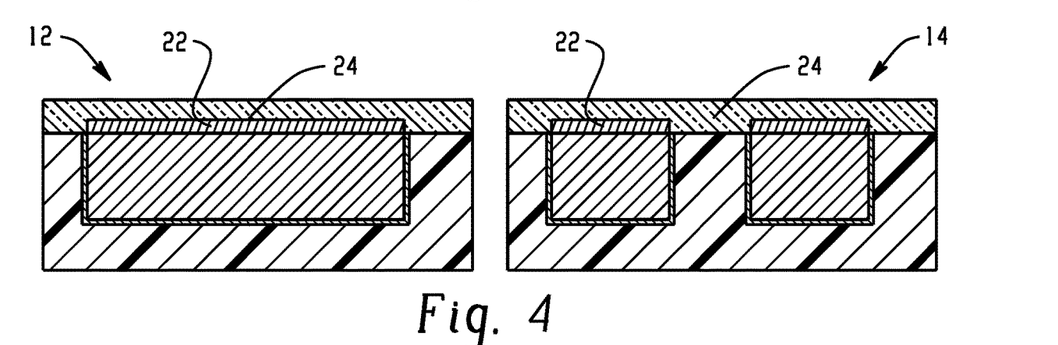
FIG. 4 illustrates sectional views of a kerf region and an active region subsequent to deposition of a sacrificial nitride layer thereon, wherein the kerf region and the active region include a barrier layer on top surfaces thereof in accordance with one or more embodiments of the present invention.

Optionally, the semiconductor wafer 10 can include a metal cap layer 22 on the surface of the metal conductor 20, which is also planarized such that the sacrificial nitride layer 16 is deposited onto the metal cap layer 22 as shown in FIG. 3. Alternatively, the metal cap layer 22 can be deposited and patterned subsequent to planarization of the substrate such that the metal cap layer 22 is on top of the metal conductor 20 and is not coplanar to the dielectric layer 16 as shown in FIG. 4.

Figure 5:
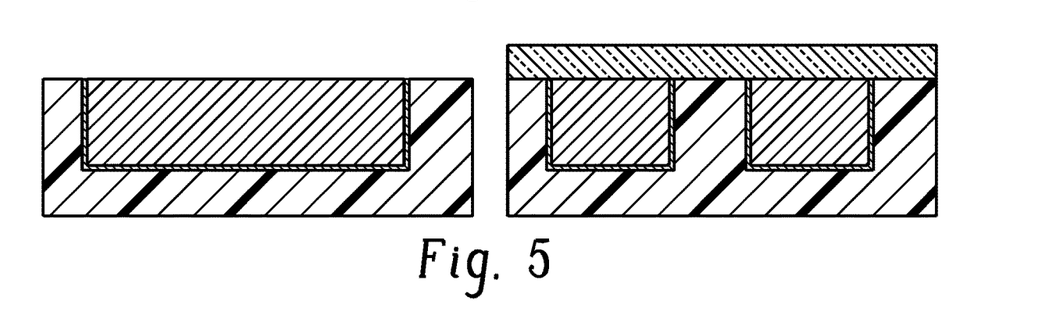
FIG. 5 illustrates sectional views of the kerf region and the active region of FIG. 2 subsequent to selective removal of the sacrificial nitride layer overlying the kerf region in accordance with one or more embodiments of the present invention.

In FIG. 5, the sacrificial nitride layer 24 is selectively removed from the kerf region 12. By way of example, the sacrificial nitride layer 24 can be selectively removed using an etch process. A block mask of photoresist can be applied and subsequently patterned using activating radiation and developed using an aqueous developer for example to expose the sacrificial nitride overlying the kerf regions. An etch process, dry or wet, can then be used to remove the sacrificial nitride layer 24.

Figure 6:
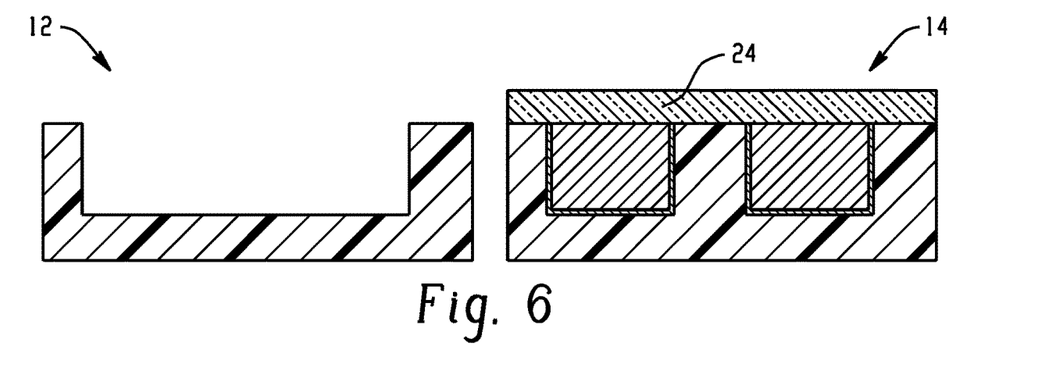
FIG. 6 illustrates sectional views of the kerf region and the active region of FIG. 5 subsequent to selective removal of a metal conductor in the kerf region in accordance with one or more embodiments of the present invention.

Referring now to FIG. 6, once the sacrificial nitride layer 24 is removed from the kerf regions 12, the underlying metal conductor 20, and optionally the liner layer 18, can be selectively removed using a wet etch process.

Figure 7:
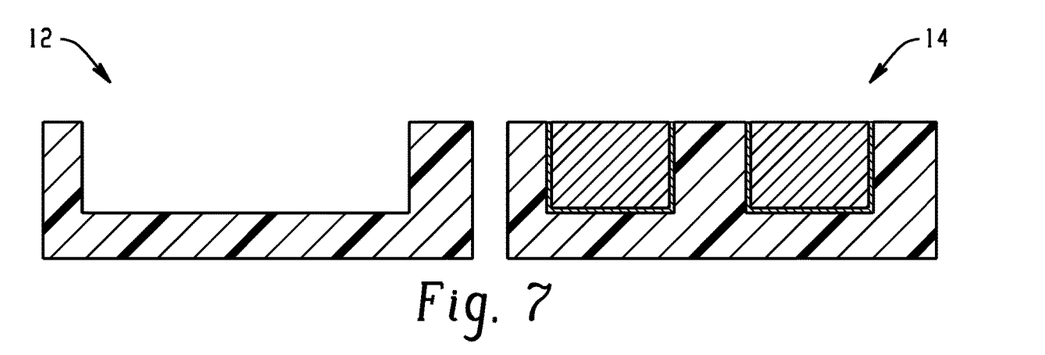
FIG. 7 illustrates sectional views of the kerf region and the active region of FIG. 6 subsequent to removal of the sacrificial nitride layer overlying the active region in accordance with one or more embodiments of the present invention.

In FIG. 7, the sacrificial nitride layer 24 is removed from the semiconductor wafer 10 including the sacrificial nitride layer overlying the device region 14.

Figure 8:
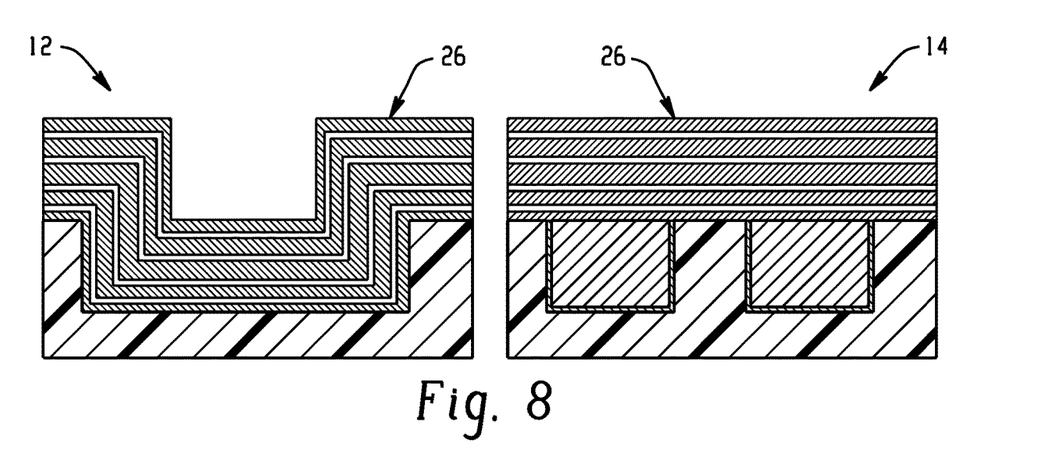
FIG. 8 illustrates sectional views of the kerf region and the active region of FIG. 7 subsequent to deposition of an optically opaque layer onto the kerf region and the active region in accordance with one or more embodiments of the present invention.

In FIG. 8, an optically opaque layer 26 can be conformally deposited in both the kerf regions 12 and the device regions 14. The optically opaque layer 26 can be a single layer or multiple layers. Moreover, the optically opaque layer 26 can be formed of one or more insulator layers, one or more metal layers, or a combination of insulator and metal layers. The materials used are generally opaque at the deposited thickness. Because the kerf regions 12 are defined by an unfilled trench, the kerf regions provide topography to the deposited opaque layer. An optional hardmask layer or layers (not shown) can be provided on the optically opaque layer 26.

Figure 9:
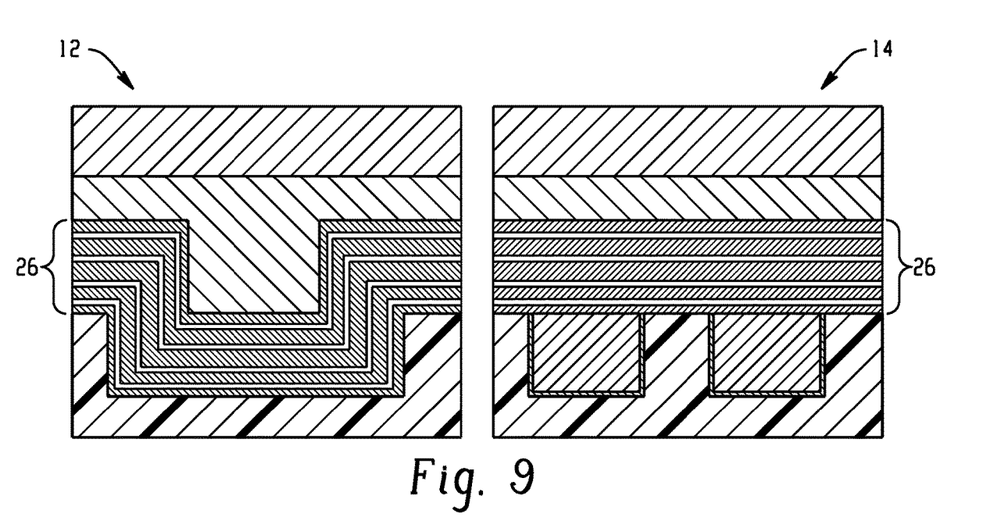
FIG. 9 illustrates sectional views of the kerf region and the active region of FIG. 8 subsequent to deposition of lithographic stack including an organic planarization layer and a photoresist onto the kerf region and the active region in accordance with one or more embodiments of the present invention.

In FIG. 9, a planarization material such as an organic planarization layer or organic dielectric layer 28 is deposited thereon. A photoresist layer 30 is deposited onto the organic planarization layer or organic dielectric layer 28.

The organic planarizing layer 28 is typically a carbon-based material having a dielectric constant of about 4.0 or less. In one or more embodiments, the dielectric constant is less than about 3.0. Exemplary materials defining the organic planarizing layer that can be employed in the invention include, but are not limited to: diamond-like carbon (DLC), fluorinated DLC, polyimides, fluorinated polyimides, parylene-N, parylene-F, benzocyclobutanes, poly(arylene ethers), polytetrafluoroethylene (PTFE) derivatives marketed by Du Pont de Nemours, Inc. under the registered trademark Teflon AF, poly(naphthalenes), poly (norbornenes), foams of polyimides, organic xerogels, porous PTFE and other nano-, micro- or macro-porous organic materials.

The organic dielectric material can be formed on the surface of substrate using conventional deposition techniques as generally discussed above. For example, chemical vapor deposition, plasma vapor deposition, sputtering, dip coating, spin-on coating, brushing, spraying and other like deposition techniques can be employed.

The photoresist 30 is not intended to be limited and can be organic base, inorganic based or a hybrid thereof. The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process to form the opening as shown.

Figure 10:
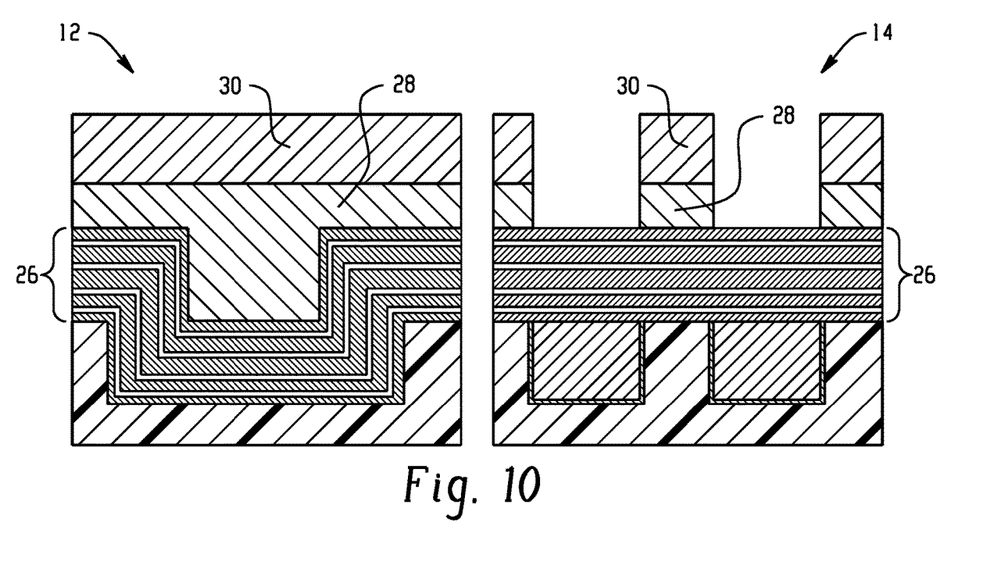
FIG. 10 illustrates sectional views of the kerf region and the active region of FIG. 8 subsequent to patterning of the lithographic stack to provide openings aligned to metal conductors in the active region using the topography provided in the kerf region in accordance with one or more embodiments of the present invention.

Referring to FIG. 10, openings to the devices in the active region 14 are made by lithographically patterning the photoresist layer 30 followed by anisotropic etching, e.g., ion beam etch, of the organic planarization layer or organic dielectric layer 28 to the opaque layer 26. To minimize overlay error, the topography in the kerf region 12 is used to align the patterning features inside the device region.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a device, the method comprising:
   providing a semiconductor wafer comprising multiple active regions separated by kerf regions, wherein the active regions and the kerf region comprise a patterned dielectric layer, a metal conductor in the patterned dielectric layer and a liner layer intermediate the dielectric layer and the metal conductor, wherein the metal conductor has an upper surface coplanar with an upper surface of the dielectric layer;
   forming an optically transparent layer on the semiconductor wafer;
   patterning the optically transparent layer to selectively remove the optically transparent layer from the kerf region;
   removing the metal conductor from the kerf region;
   removing the optically transparent layer from the active region;
   conformally depositing an optically opaque layer and creating topography in the kerf region;
   depositing a lithographic stack comprising an organic planarization layer and a photoresist layer thereon; and
   patterning openings in the lithographic stack to the optically opaque layer in the active regions using the topography in the kerf region as an alignment mark.

2. The method of claim 1, wherein the optically transparent layer comprises SiN or SiN(H).

3. The method of claim 1, wherein the dielectric layer comprises SiN, SiC, SiC (N,H), $SiO_2$, silsesquioxanes, carbon doped oxides that include atoms of Si, C, O and H, thermosetting polyarylene ethers, or multilayers thereof.

4. The method of claim 1, wherein the liner layer comprises tantalum (Ta), tantalum nitride (TaN), cobalt (Co), ruthenium (Ru), titanium (Ti), titanium nitride (TiN), tungsten nitride (WN), or combinations thereof.

5. The method of claim 1, wherein the metal conductor comprises copper (Cu), cobalt (Co), aluminum (Al), ruthenium (Ru), nickel (Ni), iridium (Jr), rhenium (Rh), tungsten (W), and or combinations including at least one of the aforementioned conductors.

6. The method of claim 1, wherein the optically opaque layer comprises a metal, an insulator, or a combination thereof.

7. The method of claim 1, wherein the optically opaque layer is a single layer.

8. The method of claim 1, wherein the optically opaque layer comprises multiple layers.

9. The method of claim 1, wherein removing the metal conductor from the kerf region defines a trench opening.

10. A method of fabricating a device, the method comprising:
    providing a semiconductor wafer comprising multiple active regions separated by a kerf region, wherein the active regions and the kerf regions comprise a patterned dielectric layer, a metal conductor in the patterned dielectric layer and a liner layer encapsulating the metal conductor, wherein the liner layer has an upper surface coplanar with an upper surface of the dielectric layer;
    forming an optically transparent layer on the semiconductor wafer;
    patterning the optically transparent layer to selectively remove the optically transparent layer from the kerf region;
    removing the metal conductor from the kerf region;
    removing the optically transparent layer from the active region;
    conformally depositing an opaque layer and creating topography in the kerf region;
    depositing a lithographic stack comprising an organic planarization layer and a photoresist layer thereon; and
    patterning openings in the lithographic stack to the opaque layer in the active regions using the topography in the kerf region as an alignment mark.

11. The method of claim 10, wherein the liner layer encapsulating the metal conductor comprises a portion on a top surface of the metal conductor that is coplanar to the dielectric layer.

12. The method of claim 10, wherein the optically opaque layer comprises a metal, an insulator, or a combination thereof.

13. The method of claim 10, wherein the optically opaque layer is a single layer.

14. The method of claim 10, wherein the optically opaque layer comprises multiple layers.

15. The method of claim 10, wherein removing the metal conductor from the kerf region defines a trench opening.

16. The method of claim 10, wherein the optically transparent layer comprises SiN or SiN(H).

17. A method of patterning an active region formed in a semiconductor wafer comprising:
    providing kerf regions between the active regions in the semiconductor wafer, wherein the active regions and the kerf regions comprise a patterned dielectric layer, a metal conductor, and a liner layer between the dielectric layer and the metal conductor;
    planarizing an upper surface of the active regions and the kerf regions to form a planar surface;
    selectively removing the metal conductor from the kerf regions to form a trench;

conformally depositing an optically opaque layer onto the semiconductor wafer to form a recessed alignment mark in the kerf regions; and patterning the active regions using the recessed alignment mark in the kerf region.

18. The method of claim 17, wherein the optically opaque layer comprises a metal, an insulator, or a combination thereof.

19. The method of claim 17, wherein the optically opaque layer is a single layer.

20. The method of claim 17, wherein the optically opaque layer comprises multiple layers.

* * * * *